US010524371B2

(12) United States Patent
Chen et al.

(10) Patent No.: US 10,524,371 B2
(45) Date of Patent: Dec. 31, 2019

(54) STORAGE COVER PLATE AND STORAGE CHASSIS USING THE SAME

(71) Applicant: CELESTICA TECHNOLOGY CONSULTANCY (SHANGHAI) CO. LTD, Shanghai (CN)

(72) Inventors: Yuxin Chen, Shanghai (CN); Yu Wang, Shanghai (CN); Wenjin Li, Shanghai (CN)

(73) Assignee: CELESTICA TECHNOLOGY CONSULTANCY (SHANGHAI) CO. LTD, Zhangjiang Hi-Tech Park, Pudong District, Shanghai (CN)

( * ) Notice: Subject to any disclaimer, the term of this patent is extended or adjusted under 35 U.S.C. 154(b) by 0 days.

(21) Appl. No.: 16/234,863

(22) Filed: Dec. 28, 2018

(65) Prior Publication Data

US 2019/0208657 A1  Jul. 4, 2019

(51) Int. Cl.
*H05K 5/02* (2006.01)
*G06F 1/18* (2006.01)
*G11B 33/00* (2006.01)

(52) U.S. Cl.
CPC .......... *H05K 5/0286* (2013.01); *G06F 1/181* (2013.01); *G06F 1/187* (2013.01); *G11B 33/00* (2013.01)

(58) Field of Classification Search
CPC ......... G06F 1/187; G06F 1/181; G11B 33/00; H05K 5/0286
See application file for complete search history.

(56) References Cited

U.S. PATENT DOCUMENTS

| 6,129,429 | A * | 10/2000 | Hardt | G06F 1/181 |
| | | | | 312/223.2 |
| 6,788,542 | B2 * | 9/2004 | Rumney | H05K 7/1421 |
| | | | | 361/724 |
| 8,416,565 | B1 * | 4/2013 | Ross | H05K 7/1492 |
| | | | | 248/551 |
| 9,055,689 | B2 * | 6/2015 | Yu | H05K 5/0226 |
| 9,380,722 | B2 * | 6/2016 | Junkins | H05K 5/0256 |
| 9,497,881 | B2 * | 11/2016 | Chen | H05K 7/1487 |
| 9,690,335 | B2 * | 6/2017 | Adrian | G06F 1/184 |
| 10,354,699 | B1 * | 7/2019 | Gopalakrishna | G06F 1/181 |
| 2009/0219701 | A1 * | 9/2009 | Wu | H05K 7/1494 |
| | | | | 361/727 |
| 2010/0007252 | A1 * | 1/2010 | Liu | G06F 1/183 |
| | | | | 312/223.2 |
| 2016/0295728 | A1 * | 10/2016 | Alvarado | H05K 5/03 |

* cited by examiner

*Primary Examiner* — Nidhi Thaker
(74) *Attorney, Agent, or Firm* — Global IP Services; Tianhua Gu

(57) ABSTRACT

The present disclosure provides a storage cover plate and a storage chassis using the same. The storage cover plate is covered on a storage chassis for accommodating a plurality of storages, wherein the storage cover plate comprises a plurality of closely arranged sub-covers, the plurality of closely arranged sub-covers each corresponds to a row of storages respectively, the plurality of the sub-covers each is capable of sliding along edges of the storage chassis, and the outermost sub-cover is locked with the storage chassis through a locking part. If one of storages needs to be operated, an unlocking operation is performed first and then the sub-cover above the storage is pushed, so that the storage below the sub-cover can be operated directly. The present disclosure is easy to install and convenient to assemble, disassemble and maintain, therefore achieving high economical efficacy and practicability.

5 Claims, 2 Drawing Sheets

STORAGE COVER PLATE AND STORAGE CHASSIS USING THE SAME

CROSS REFERENCES TO RELATED APPLICATIONS

This application claims the benefits of priority to Chinese Patent Application No. CN2017114766096, entitled "Storage Cover Plate and Storage Chassis Using the Same", filed with the Chinese Patent Office on Dec. 29, 2017, and Chinese Patent Application No. CN2017219020754, entitled "Storage Cover Plate and Storage Chassis Using the Same", filed with the Chinese Patent Office on Dec. 29, 2017, the contents of which are incorporated herein by reference in its entirety.

BACKGROUND OF THE PRESENT INVENTION

Field of Invention

The present disclosure relates to technical filed of electronic device, and in particular, to a storage cover plate and a storage chassis using the same.

Description of Related Arts

An electronic device such as a portable computer has a storage chassis for accommodating storages. The storage chassis is located in a housing of the device. The storage chassis is provided with an opening in the bottom of the housing. The opening is used for inserting the storage module into the storage chassis and detaching the storage module from the storage chassis. The opening is closed by a cover.

A regular cover is flat, such as a plate, and the outer periphery of the cover fits with the chassis of the housing.

The large-capacity storage device includes a large number of storages, the storages need to be replaced or perform other operations frequently. Therefore, operations on the storages are required to be easy and convenient.

SUMMARY OF THE PRESENT INVENTION

In view of the foregoing disadvantage of the prior art, an object of the present application is to provide a storage cover plate and a storage chassis using the same, so as to resolve the problem in the prior art that due to the cover plate, a storage cannot be replaced or operated rapidly when a storage chassis accommodates a large number of storages.

In order to accomplish the above and other related objects, the present application provides a storage cover plate covered on a storage chassis for accommodating a plurality of storages, wherein the storage cover plate comprises a plurality of closely arranged sub-covers, the plurality of closely arranged sub-covers each corresponds to a row of storages respectively, the plurality of the sub-covers each is capable of sliding along edges of the storage chassis, and the outermost sub-cover is locked with the storage chassis through a locking part.

In an embodiment of the present application, the sub-cover has a width matching with the width of each row of storage.

In an embodiment of the present application, the locking part comprises slots provided on the edges of the storage chassis and hooks provided on both sides of the sub-cover.

In an embodiment of the present application, two locking parts are provided, which are installed on both sides of the outermost sub-cover.

An embodiment of the present application further provides a storage chassis, which is used for accommodating multiple storages and comprises the aforementioned storage cover plate covered on the storage chassis.

As described above, the storage cover plate according to the present disclosure comprises a plurality of closely arranged sub-covers each corresponds to a row of storages respectively, where the plurality of sub-covers are capable of sliding along edges of the storage chassis, and the outermost sub-cover is locked with the storage chassis through a locking part. If a particular storage needs to be operated, an unlocking operation is performed first and then the sub-cover above the storage is pushed, so that the storage below the sub-cover can be operated directly. The present application is easy to install and convenient to assemble, disassemble and maintain, therefore achieving high economical efficacy and practicability.

| Descriptions of component mark numbers | |
| --- | --- |
| 100 | Storage cover plate |
| 110 | Sub-cover |
| 111 | Groove |
| 112 | Vent hole or connection hole |
| 120 | Locking part |
| 200 | Storage chassis |

DETAILED DESCRIPTION OF THE PREFERRED EMBODIMENTS

Implementations of the present disclosure are illustrated below through specific embodiments. A person skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

This embodiment provides a storage cover plate, so as to resolve the problems in the prior art that assembly and disassembly of a hard-disk cartridge are complex, and that a hard disk is easily damaged when the hard disk is plugged for multiple times. A storage cover plate according to this embodiment and a storage chassis using the same will be described in detail in the following, so that a person skilled in the art can understand the storage cover plate according to this embodiment and the storage chassis using the same without making creative efforts.

Figure 1:
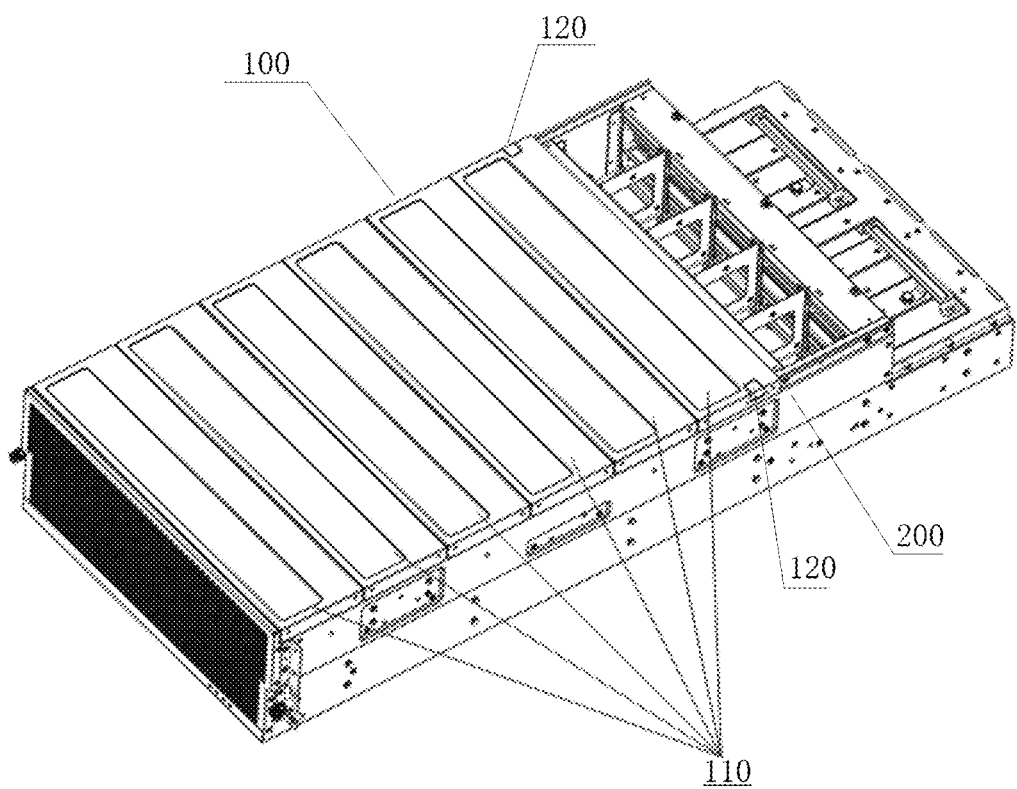
FIG. 1 is a schematic diagram when the storage cover plate according to the present disclosure is covered on a storage chassis.
Figure 2:
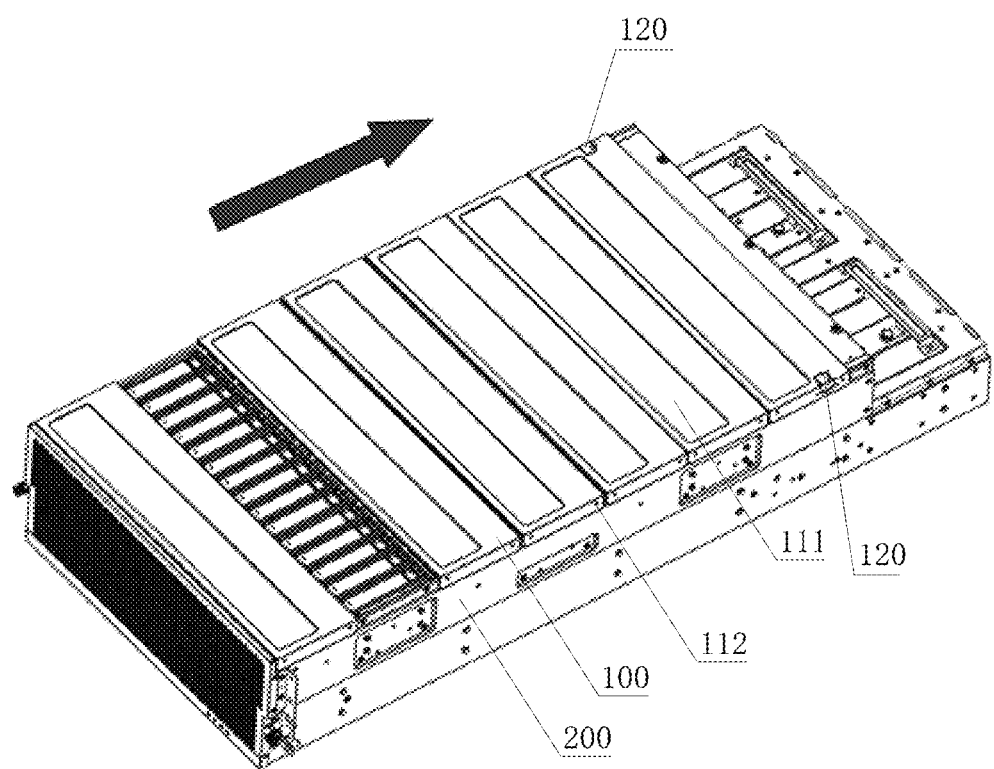
FIG. 2 is a schematic diagram of a storage cover plate according to the present disclosure when one of the sub-covers is pushed.

FIG. 1 and FIG. 2 are schematic diagrams of a storage cover plate 100 according to the present disclosure in a specific embodiment.

As shown in FIG. 1, this embodiment provides a storage cover plate 100 covered on a storage chassis 200, the storage chassis 200 accommodates a plurality of storages. The storage cover plate 100 comprises a plurality of closely arranged sub-covers 110, the plurality of the sub-covers each corresponds to a row of the storages respectively. For example, five storages are configured in the storage chassis 200, the storage cover plate 100 includes five closely arranged sub-covers 110, each of the sub-covers corresponds to one of the five storages respectively.

As shown in FIG. 2, the sub-covers 110 are capable of sliding along edges of the storage chassis 200. The outermost sub-cover 110 of is locked with the storage chassis 200 through a locking part 120.

As shown in FIG. 2, the plurality of the sub-covers 110 each is capable of sliding along the edges of the storage chassis 200. If a storage needs to be operated, unlocking the locking part 120, then pushing the sub-cover 110 corresponding to the storage, all the sub-covers 110 behind the sub-cover 110 can be driven to slide along the pushing direction, so that the pushed sub-cover 110 is moved away from the surface of the corresponding storage, thereby achieving the object of operating the storage.

For example, as shown in FIG. 2, if an operation needed to be performed is on the second row, unlocking the storage cover plate 100, then pushing the sub-cover 110 corresponding to the second-row storage, so that the operation is performed.

In this embodiment, the sub-cover 110 has a width matching with the width of each row of storage covered.

Specifically, in this embodiment, the sub-cover 110 comprises a panel and side plates connected to ends of the panel in a bent manner. The side plate is provided with a vent hole or a connection hole. The sub-cover 110 may be provided with a groove 111 on its surface as required.

Specifically, in this embodiment, the locking part 120 comprises, but is not limited to, slots provided on the edges of the storage chassis 200 and hooks provided on the surface of the sub-cover 110, so that the storage cover plate 100 can be locked and unlocked without using other unlocking tools. In another embodiment, the locking part 120 may be other locking forms, which is not limited to the slot-hook locking form.

In this embodiment, two locking parts 120 are provided, which are installed on two sides of the outermost sub-cover 110. In this embodiment, the sub-cover 110 is designed to achieve the purpose of independently controlling operations on each row of storage. Besides, the storage cover plate 100 can be unlocked and secured without using any tool, so that the operation is easy and convenient.

In addition, this embodiment further provides a storage chassis. The storage chassis accommodates a plurality of storages and comprises the aforementioned storage cover plate 100 covered on the storage chassis 200. The storage cover plate 100 has been described in detail above, and is not described in detail herein again.

In conclusion, the storage cover plate according to the present disclosure comprises a plurality of closely arranged sub-covers each corresponds to a row of storages respectively, where the plurality of sub-covers are capable of sliding along edges of the storage chassis, and the outermost sub-cover is locked with the storage chassis through a locking part. If a particular storage needs to be operated, an unlocking operation is performed first and then the sub-cover above the storage is pushed, so that the storage below the sub-cover can be operated directly. The present disclosure is easy to install and convenient to assemble, disassemble and maintain, therefore achieving high economical efficacy and practicability. Therefore, the present disclosure effectively overcomes various disadvantages in the prior art and hence has high industrial use value.

The foregoing embodiments are only to illustrate the principle and efficacy of the present disclosure exemplarily, and are not to limit the present disclosure. Any person skilled in the art can make modifications or variations on the foregoing embodiments without departing from the spirit and scope of the present disclosure. Accordingly, all equivalent modifications or variations completed by a person of ordinary skill in the art without departing from the spirit and technical thinking disclosed by the present disclosure should fall within the scope of claims of the present disclosure.

What is claimed is:

1. A storage cover plate, covered on a storage chassis for accommodating a plurality of storages, wherein the storage cover plate comprises a plurality of closely arranged sub-covers, the plurality of closely arranged sub-covers each corresponds to a row of storages respectively, the plurality of the sub-covers each is capable of sliding along edges of the storage chassis, and the outermost sub-cover is locked with the storage chassis through a locking part.

2. The storage cover plate according to claim 1, wherein the sub-cover has a width matching with the width of each row of storage.

3. The storage cover plate according to claim 1, wherein the locking part comprises slots provided on the edges of the storage chassis and hooks provided on both sides of the sub-cover.

4. The storage cover plate according to claim 1, wherein two locking parts are provided, which are installed on both sides of the outermost sub-cover.

5. The storage chassis, used for accommodating the plurality of storages, wherein the storage chassis comprises the storage cover plate according to claim 1 covered on the storage chassis.

* * * * *